United States Patent
Dhindsa et al.

(10) Patent No.: US 8,097,120 B2
(45) Date of Patent: Jan. 17, 2012

(54) PROCESS TUNING GAS INJECTION FROM THE SUBSTRATE EDGE

(75) Inventors: Rajinder Dhindsa, San Jose, CA (US); Mukund Srinivasan, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 581 days.

(21) Appl. No.: 11/359,300

(22) Filed: Feb. 21, 2006

(65) Prior Publication Data

US 2007/0193688 A1  Aug. 23, 2007

(51) Int. Cl.
| | |
|---|---|
| C23C 16/455 | (2006.01) |
| C23C 16/50 | (2006.01) |
| C23C 16/458 | (2006.01) |
| C23F 1/00 | (2006.01) |
| H01L 21/306 | (2006.01) |
| C23C 16/06 | (2006.01) |
| C23C 16/22 | (2006.01) |

(52) U.S. Cl. ............... 156/345.33; 118/715; 118/723 R
(58) Field of Classification Search ............. 118/723 R, 118/715; 156/345.33
See application file for complete search history.

(56) References Cited

U.S. PATENT DOCUMENTS

| | | | | | |
|---|---|---|---|---|---|
| 4,512,283 | A | * | 4/1985 | Bonifield et al. | 118/723 E |
| 4,513,021 | A | * | 4/1985 | Purdes et al. | 427/579 |
| 4,738,748 | A | * | 4/1988 | Kisa | 438/727 |
| 5,338,363 | A | * | 8/1994 | Kawata et al. | 118/725 |
| 5,415,728 | A | * | 5/1995 | Hasegawa et al. | 438/710 |
| 5,498,313 | A | * | 3/1996 | Bailey et al. | 438/710 |
| 5,505,781 | A | * | 4/1996 | Omori et al. | 118/726 |
| 5,556,476 | A | * | 9/1996 | Lei et al. | 118/728 |
| 5,578,532 | A | * | 11/1996 | van de Ven et al. | 438/584 |
| 5,681,614 | A | * | 10/1997 | Omori et al. | 427/248.1 |
| 5,688,331 | A | * | 11/1997 | Aruga et al. | 118/725 |
| 5,708,556 | A | | 1/1998 | Van Os et al. | |
| 5,711,815 | A | * | 1/1998 | Lee et al. | 118/725 |
| 5,772,771 | A | * | 6/1998 | Li et al. | 118/723 I |
| 5,851,294 | A | | 12/1998 | Young et al. | |
| 6,001,267 | A | * | 12/1999 | Os et al. | 216/67 |
| 6,013,155 | A | | 1/2000 | McMillin et al. | |
| 6,040,011 | A | * | 3/2000 | Yudovsky et al. | 427/255.28 |
| 6,042,687 | A | * | 3/2000 | Singh et al. | 156/345.33 |
| 6,070,551 | A | * | 6/2000 | Li et al. | 118/723 I |
| 6,096,135 | A | * | 8/2000 | Guo et al. | 118/729 |
| 6,178,918 | B1 | * | 1/2001 | van Os et al. | 118/723 R |
| 6,179,924 | B1 | * | 1/2001 | Zhao et al. | 118/725 |
| 6,190,459 | B1 | * | 2/2001 | Takeshita et al. | 118/715 |
| 6,206,976 | B1 | * | 3/2001 | Crevasse et al. | 118/720 |
| 6,263,829 | B1 | * | 7/2001 | Schneider et al. | 118/723 I |
| 6,375,750 | B1 | * | 4/2002 | van Os et al. | 118/728 |
| 6,414,834 | B1 | * | 7/2002 | Weldon et al. | 361/234 |
| 6,432,259 | B1 | * | 8/2002 | Noorbakhsh et al. | 156/345.33 |

(Continued)

OTHER PUBLICATIONS

International Search Report (2 pages).

*Primary Examiner* — Rudy Zervigon

(74) *Attorney, Agent, or Firm* — Martine Penilla Group, LLP

(57) ABSTRACT

Broadly speaking, the embodiments of the present invention provides an improved plasma processing mechanism, apparatus, and method to increase the process uniformity at the very edge of the substrate. In one embodiment, a plasma processing chamber comprises a substrate support configured to receive a substrate, and a plurality of tuning gas injection holes surrounding the edge of the substrate, wherein the tuning gas injection holes supplies a tuning gas to the edge of the substrate during plasma processing of the substrate.

17 Claims, 4 Drawing Sheets

U.S. PATENT DOCUMENTS

| | | | |
|---|---|---|---|
| 6,501,191 B2 * | 12/2002 | Tanaka et al. | 219/390 |
| 6,660,096 B2 * | 12/2003 | Takeshita et al. | 118/726 |
| 6,666,920 B1 * | 12/2003 | Sillmon et al. | 118/715 |
| 6,676,758 B2 * | 1/2004 | Sillmon et al. | 118/715 |
| 6,676,760 B2 * | 1/2004 | Kholodenko et al. | 118/728 |
| 6,808,567 B2 * | 10/2004 | Takeshita et al. | 118/715 |
| 6,833,052 B2 * | 12/2004 | Li et al. | 156/345.48 |
| 6,837,967 B1 | 1/2005 | Berman et al. | |
| 6,846,364 B2 * | 1/2005 | Pyo | 118/725 |
| 6,897,155 B2 * | 5/2005 | Kumar et al. | 438/706 |
| 7,022,627 B2 * | 4/2006 | Granneman et al. | 438/799 |
| 7,217,670 B2 * | 5/2007 | van Kesteren | 438/795 |
| 7,323,231 B2 * | 1/2008 | Derderian | 427/576 |
| 7,410,355 B2 * | 8/2008 | Granneman et al. | 432/5 |
| 7,520,957 B2 * | 4/2009 | Kao et al. | 156/345.43 |
| 7,550,381 B2 * | 6/2009 | Lu et al. | 438/655 |
| 7,601,224 B2 * | 10/2009 | Foree | 118/725 |
| 7,632,356 B2 * | 12/2009 | Tomita et al. | 118/728 |
| 7,749,326 B2 * | 7/2010 | Kim et al. | 118/715 |
| 7,887,669 B2 * | 2/2011 | Satou et al. | 156/345.1 |
| 2002/0014204 A1 * | 2/2002 | Pyo | 118/715 |
| 2002/0017244 A1 * | 2/2002 | Sillmon et al. | 118/715 |
| 2003/0019580 A1 | 1/2003 | Strang | |
| 2007/0193688 A1 * | 8/2007 | Dhindsa et al. | 156/345.43 |

\* cited by examiner

PROCESS TUNING GAS INJECTION FROM THE SUBSTRATE EDGE

BACKGROUND

In the fabrication of semiconductor based devices (e.g. integrated circuits or flat panel displays), layers of material may alternately be deposited onto and etched from a substrate surface (e.g., the semiconductor wafer or the glass panel). As is well known in the art, the deposition of material layer(s) and etching of the material layer(s) may be accomplished by a variety of techniques, including plasma-enhanced deposition and etching. In plasma-enhanced deposition or etching, the actual deposition or etching of the substrate takes place inside a plasma processing chamber. During the deposition or etching process, a plasma is formed from a suitable source gas to deposit a material layer on the substrate or to etch areas of substrate that are unprotected by the etch mask, leaving behind the desired pattern.

The shrinking feature sizes and the implementation of new materials in next generation of device fabrication on larger substrate sizes have challenged plasma etch and plasma deposition processing equipments to maintain the uniformities or process results from centers to the very edges of substrates. The larger sizes of the substrates and the smaller device sizes result in larger numbers of devices close to the very edges of the substrates (or wafers). This makes controlling of processing results at the very edges of substrates very critical.

At the very edge of the substrate, the deposition or etching plasma non-uniformity increases due to a few factors. For example, during plasma etching, the etching by-product concentration at the substrate edge is different from the center of the substrate due to the lacking of etching by-product source beyond the substrate edge. The lower etching by-product concentration can affect the etching uniformity at the very edge of the substrate. In addition, the substrate temperature is different at the substrate edge. Conventional plasma etching system usually has a substrate cooling mechanism in the substrate support to cool the substrate during etching process to maintain the substrate at a certain temperature. The very edge of the substrate sometimes hangs outside the substrate support and does not receive the same degree of cooling from the cooling mechanism in the substrate support as the rest of the substrate. The different substrate temperature at the very edge of the substrate can also increase the etching non-uniformity at the very edge of the substrate. Additionally, the etching gas concentration at the very edge of the substrate is different from the etching gas concentration over the rest of the substrate due to overloading of etching gas at the very edge of the substrate. The overloading is caused by less etching gas being consumed by the etching process at the very edge of the substrate compared to etching gas being consumed over the rest of the substrate. This overloading of etching gas can also increase the etching non-uniformity at the very edge of the substrate. The RF coupling effect at the very edge of the substrate is also different from the rest of the substrate due to the edge of the substrate overhanging the support and also due to the different material used for the edge ring that surrounds the substrate support. The different RF coupling effect can affect plasma generation efficiency and density and therefore can increase the etch non-uniformity at the very edge of the substrate.

Although not affected by the same factors as plasma etching processes, plasma deposition processes also show increased edge non-uniformity. Typically, the edge non-uniformity affects up to 20 mm to 30 mm from the very edge of the substrate. The plasma uniformity within this region (20 mm to 30 mm from the very edge of the substrate) makes the deposition or etching uniformity much worse than the rest of the substrate, especially within about 10 mm to the very edge of the substrate. The poor edge uniformity renders the devices that are within about 10 mm to the very edge of the substrate non-usable.

In view of the foregoing, there is a need for a method and apparatus that provides an improved plasma processing mechanism to increase the process uniformity at the very edge of the substrate to increase device yield of semiconductor substrates.

SUMMARY

Broadly speaking, the present invention fills these needs by providing an improved plasma processing mechanism to increase the process uniformity at the very edge of the substrate. It should be appreciated that the present invention can be implemented in numerous ways, including as a process, an apparatus, or a system. Several inventive embodiments of the present invention are described below.

In one embodiment, a plasma processing chamber comprises a substrate support configured to receive a substrate, and a plurality of tuning gas injection holes surrounding the edge of the substrate, wherein the tuning gas injection holes supplies a tuning gas to the edge of the substrate during plasma processing of the substrate.

In another embodiment, a tuning gas assembly for a plasma processing system comprises a plurality of tuning gas injection holes surrounding an edge of an substrate in the plasma processing system, wherein the tuning gas injection holes supplies a tuning gas to the edge of the substrate during plasma processing of the substrate.

In yet another embodiment, a method of improving plasma uniformity at an edge of a substrate in a plasma processing chamber comprises supplying a tuning gas to the edge of the substrate from a plurality of tuning gas injection holes surrounding the edge of the substrate in the plasma processing system during plasma processing of the substrate, wherein the tuning gas injection holes are part of a tuning gas assembly, which comprise an edge tuning gas plenum. The tuning gas assembly further comprises a plurality of tuning gas injection channels, wherein the plurality of tuning gas injection holes are connected to the edge tuning gas plenum surrounding the substrate support through the plurality of tuning gas injection channels. The plurality of tuning gas injection holes are at the ends of the plurality of tuning gas injection channels and the plurality of tuning gas injection channels are inside a hard-edge ring coupled to a substrate support.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

Several exemplary embodiments for an improved plasma etching system, method and apparatus will now be described. It will be apparent to those skilled in the art that the present invention may be practiced without some or all of the specific details set forth herein. It will also be apparent to those skilled in the art that the present invention may be practiced for plasma deposition.

As described earlier, due to increasing sizes of substrate and smaller feature sizes, a large number of devices exist on the very edge of substrate. Improving process uniformity at the very edge of substrate would improve yield of devices on the very edge of substrate. One embodiment of the present invention provides a process tuning gas source at the very edge of the substrate. For the following description of the various embodiments of the invention, we will use etching plasma as an example. However, the concept can apply to plasma deposition and plasma deposition chambers.

For plasma etching processes, the etch rates tend to drop significantly at the very edge of the substrate due to factors such as different etching by-product concentration, different substrate temperature, different etching gas concentration, and different RF coupling effect at the very edge of substrate. To increase the etching rate at the very edge of substrate, many schemes have been tried, including using dual-gas feed to supply different concentrations of reactive gas(es) from the center and the edge of the gas distribution plate. Although dual-gas feed improves the etching rate at the very edge of substrate, improvement are provided through the embodiment described herein. Details of dual-gas feed is described in commonly assigned U.S. Pat. No. 6,432,831, titled "Gas Distribution Apparatus for Semiconductor Processing," issued on Aug. 13, 2002, which is incorporated here for reference.

Figure 1:
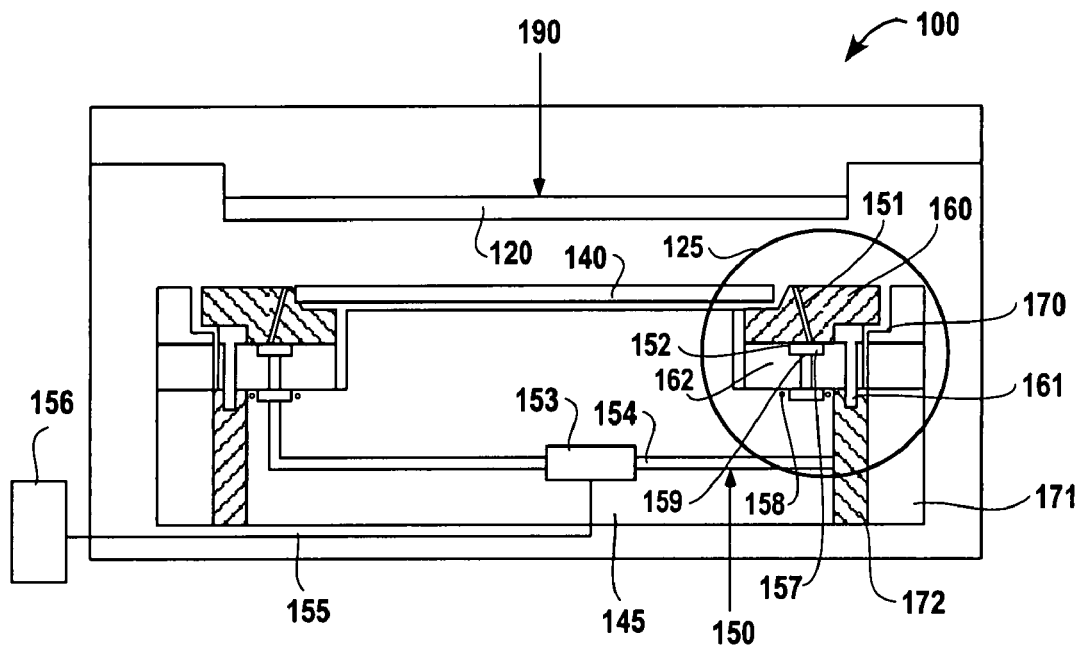
FIG. 1 shows a schematic cross-sectional diagram of one embodiment of a substrate etching system.

In one embodiment, a process tuning gas is supplied from a tuning gas source right next to the edge of the substrate. FIG. 1 shows a cross-sectional view of a plasma processing apparatus 100 that has a tuning gas source surrounding the substrate support. This embodiment includes a substrate support 145, which is also an electrode, that is composed of a conductive material and is operatively coupled to a power supply (not shown). The RF power supply may be a multiple frequency power supply. For example, the power source can have a mixture of frequencies at 2 MHz, 27 MHz, and/or 60 MHz. Plasma may be generated when RF power is communicated to the electrode (or substrate support 145) to the process gas inside the process chamber. The process gas is supplied to the process chamber through gas feed 190 to the gas distribution plate 120, which may also be an electrode.

Surrounding the substrate support 145 is an edge ring 160 that provides tuning gas injection channels 151, which is part of the tuning gas assembly 150. The edge ring 160 may be made of semi-conductive material, such as silicon, or made of insulator. Below the edge ring 160 is a coupling ring 162, which houses an edge tuning gas plenum 152 and tuning gas supply channels 154. The edge tuning gas plenum 152 and the tuning gas supply channels are also part of the tuning gas assembly 150. The coupling ring 162 may be made of dielectric material, such as quartz. The coupling ring 162 provides connection between the edge ring 160 and the lower end of the substrate support 145.

In one embodiment, spacer ring 170 is disposed next to the edge ring 160. The spacer ring 170 may be made of insulator, such as quartz. The spacer ring is disposed above a insulating material 171. The insulating material 171 may be made of insulator, such as quartz. The insulating material 171 is coupled to a peripheral ring 172, which allows the insulating material 171 to be attached to the substrate support 145. The peripheral ring may be made of insulator, such as ceramic. The edge ring 160, the coupling ring 162 and the peripheral ring 172 may be secured together by a securing device 161. In one embodiment the securing device 161 may be a bolt. One skilled in the art will appreciate that only suitable securing devices may be used here.

The tuning gas supply channels 154 intersect the edge tuning gas plenum 152 at junctions 159. At the interface between the coupling ring 162 and the lower portion of substrate support 145, there may be an optional interfacial plenum 157. The coupling ring is secured to the substrate support 145 by a securing device 158. Tuning gas supply channels 154 are connected to a central tuning gas plenum 153, which is disposed within the substrate support 145. Tuning gas(es) is supplied from a tuning gas container(s) 156 to the central tuning gas plenum 153 through a tuning gas line 155. The tuning gas described here could be a single gas or a mixture of gases. It should be appreciated that there may be more than one tuning gas container, if more than one type of tuning gases are used.

The substrate 140 may be electrostatically clamped or "chucked" to the substrate support 145 using well-known systems and methods. These well-known systems and methods include coating the substrate support 145 (or electtode) with a dielectric material that incorporates high-voltage electrodes (not shown) for chucking and dechucking purposes.

Figure 2:
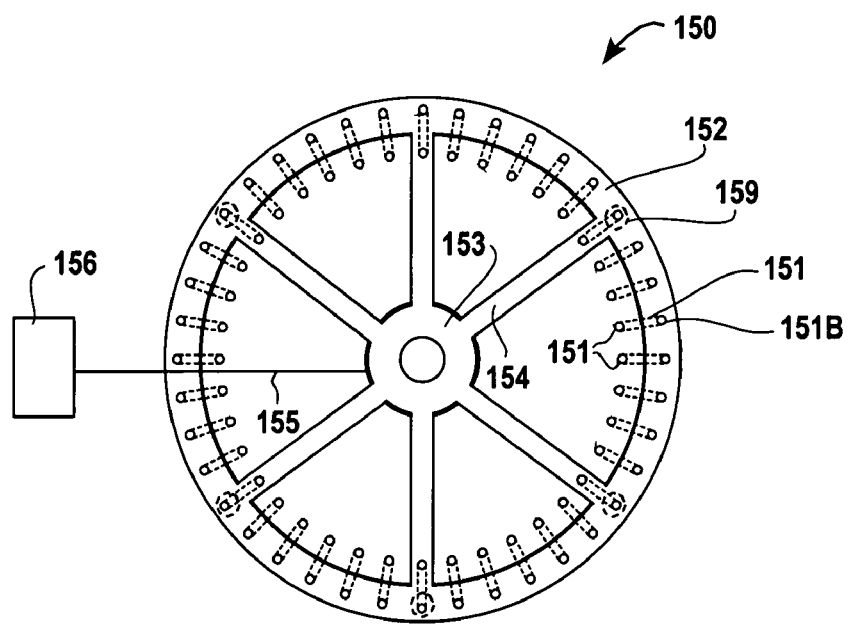
FIG. 2 shows a top view of an embodiment of the tuning gas assembly.

FIG. 2 shows an embodiment of a top view of the tuning gas supply assembly 150. The central tuning gas plenum 153 receives the supply of tuning gas from the tuning gas container 156 through a tuning gas line 155. The central tuning gas plenum 153 supplies tuning gas to the edge tuning gas plenum 152 through six tuning gas supply channels 154, which are distributed evenly around the central tuning gas plenum 253. It should be appreciated that there could be more than six or less than six of tuning gas supply channels 154. The tuning gas supply channels 154 are distributed evenly around the circumference of the central tuning gas plenum 153 in a spoke pattern. The tuning gas supply channels 154 intersect with the edge tuning gas plenum 152 at junctions 159. On the top surface of the edge tuning gas plenum 152 and also at the bottom of the tuning gas injection channels 151 are the bottoms of tuning gas injection channels $151_B$. The tops of the tuning gas injection channels $151_T$ and the tuning gas injection channels 151 are also shown in FIG. 2. As shown in the FIG. 2, there could be many tuning gas injection channels. In one embodiment, the number of tuning gas injection channels 151 may range between about 12 to about 1200. Typically, the tuning gas injection channels are cylinders with diameters between about 0.3 mm to about 5 mm. In one embodiment, the diameter of the injection channel 151 is 0.5 mm. However, the tuning gas injection channels do not have to be cylindrical and can be in other shapes, such as a cone or inverted cone. The embodiment in FIG. 2 shows that the tuning gas injection channels 151 point toward the center of the substrate. However, the tuning gas injection channels 151 do not necessary point toward the center of the substrate. As long as the channels 151 point to the edge (or circumference) of the substrate, the tuning gas can be delivered to the desired region, which is the edge of the substrate. The tuning gas is supplied to central tuning gas plenum 153 first to uniformly distribute the tuning gas to the edge tuning gas plenum 152.

Figure 3A:
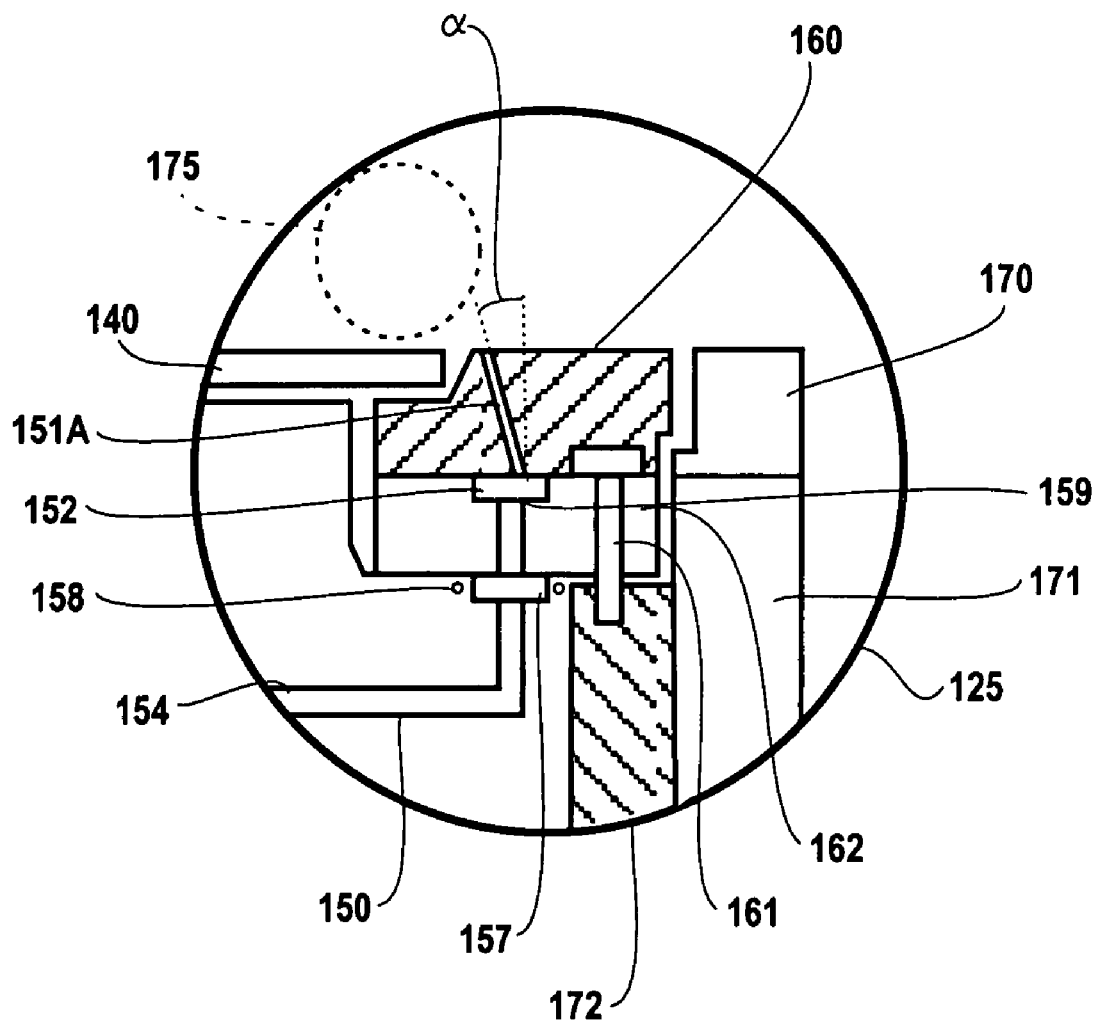
FIG. 3A shows an embodiment of an enlarged area 125 of FIG. 1.

FIG. 3A shows an embodiment of an enlarged view of circle 125 of FIG. 1. In this embodiment, the tuning gas injection channels 151A is drilled at an angle α from the vertical axis X. The angle α can be between about 0 degree to about 60 degrees, preferably between about 10 degrees to about 30 degrees. The angle α of the tuning gas injection channels 151A affects the direction of the tuning gas being carried on the substrate surface, and, therefore, affects how the tuning gas is distributed near the edge of the substrate. The tuning gas is directed toward a region 175 above the surface of the edge of the substrate. Using high aspect ratio contact (HARC) etch as an example, the processing gas for HARC includes gases, such as $O_2$, $CF_4$, $C_4F_6$, $C_4F_8$ and Ar. $C_4F_6$ and $C_4F_8$ are polymerizing gases that help to make sidewall polymers to protect the etched contact sidewall. Additional tuning gas, such as $O_2$, $CF_4$, $C_4F_6$, $C_4F_8$, Ar, or a combination of these gases, may be supplied to the edge of the substrate to improve the etch uniformity at the very edge of the substrate. In one embodiment, the flow rate may be between about 1 sccm to about 20 sccm. Another example is photoresist ashing where oxygen is the main reactive gas in photoresist ashing. Therefore, $O_2$ can be used as tuning gas in the embodiments described herein. The flow rate of $O_2$ tuning gas may be between about 1 sccm to about 20 sccm in one embodiment. The $O_2$ tuning gas can also be diluted with an inert gas, such as He.

Figure 3B:
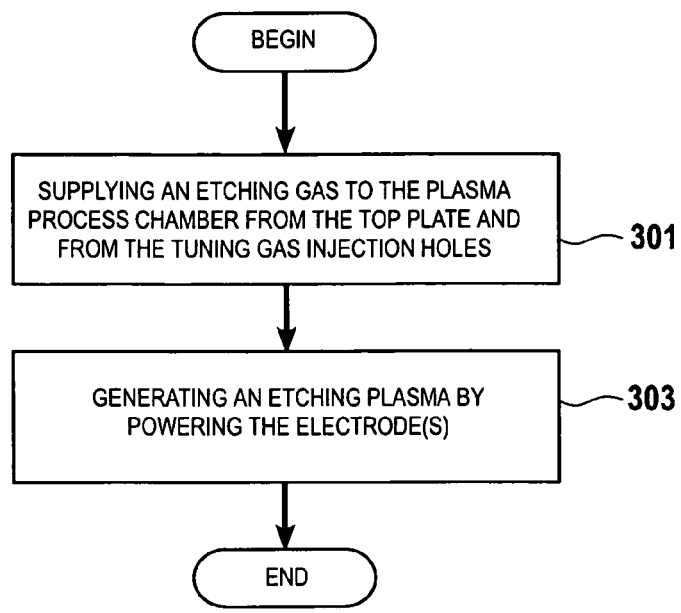
FIG. 3B shows a process flow of using a process flow of using a tuning gas at the substrate edge to improve etch uniformity at the very edge of the substrate

FIG. 3B shows a process flow of using a tuning gas at the substrate edge to improve etch uniformity at the very edge of the substrate. At operation 301, an etching gas (or gas mixture) is supplied to the plasma process chamber from the main gas source, such as from the gas distribution plate, and also from the tuning gas injection holes. At operation 303, an etching plasma is generated by powering the electrode(s). With the introduction of the tuning gas, the etch rate at the substrate edge can be increased and etch uniformity at the very edge of substrate can be improved. Typically, the edge non-uniformity renders the devices that are within about 10 mm to the very edge of the substrate non-usable. However, the edge non-uniformity affects up to 20 mm to 30 mm from the very edge of the substrate. With the introduction of the tuning gas, the edge non-uniformity can be greatly improved, or even completely eliminated.

Figure 3C:
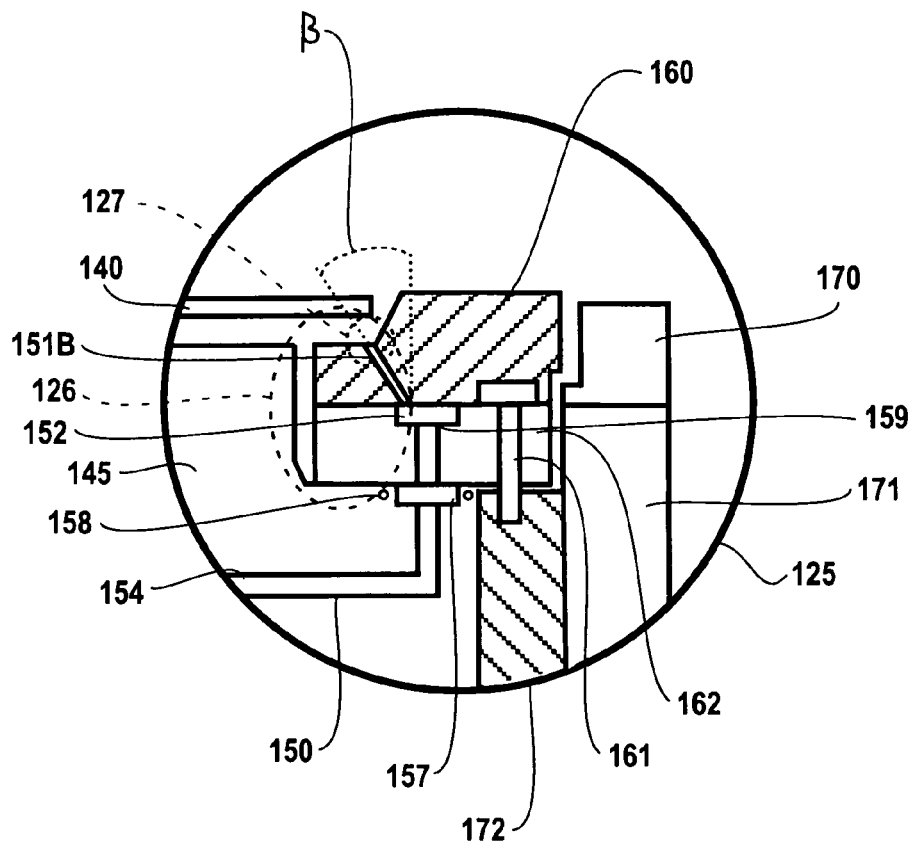
FIG. 3C shows another embodiment of an enlarged area 125 of FIG. 1.

FIG. 3C shows another embodiment of an enlarged view of circle 125 of FIG. 1. The tuning gas injection channels can be used to supply inert gas to the region 126 below the substrate 140 to prevent deposition of etch by-product in the exposed region 126 below the substrate 140. In this embodiment, the tuning gas injection channels 151B is drilled at an angle β from the vertical axis X. The angle β can be between about 0 degree to about 90 degrees, preferably between about 30 degrees to about 60 degrees. The angle β of the tuning gas injection channels 151B affects the direction of the inert gas being carried on the substrate surface and therefore affects how the inert gas is distributed near the backside of the edge of the substrate. The tops of the tuning gas injection channels 151B$_T$ are below the substrate 140. The tops of tuning gas injection channels direct the inert gas toward an exposed region 127 at the edge of the substrate and right below the edge of the substrate to prevent etch by-product entering the exposed region 126 below the edge of the substrate 140 to thereby precluding backside deposition. Etch by-product (polymer) deposited on the backside of substrate, also called bevel polymer, is very hard to clean and can generate particles. Inert gas, such as He or Ar, can be supplied to the tuning gas injection channels 151B. In one embodiment, the inert gas can be flowed at a total flow rate between about 10 sccm to about 200 sccm.

Figure 3D:
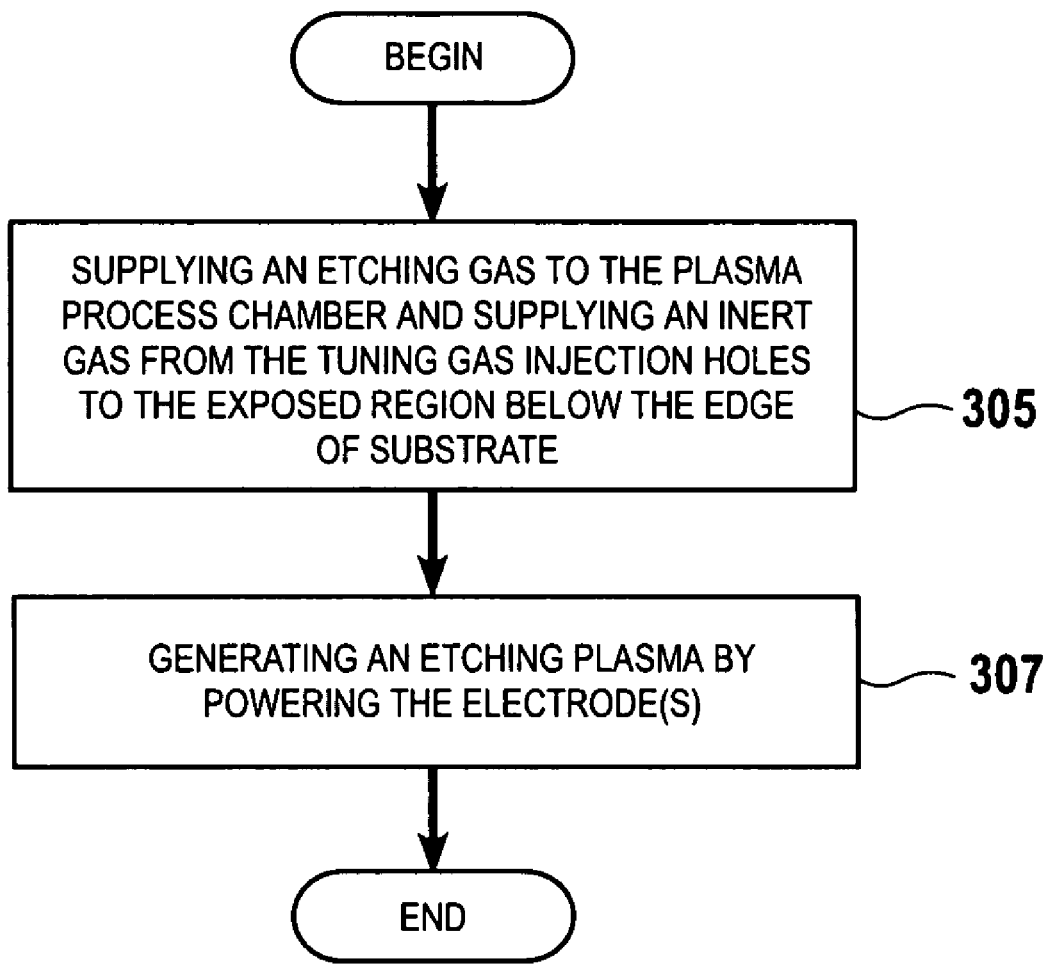
FIG. 3D shows a process flow of using the tuning gas at the substrate edge to prevent substrate backside etch by-product deposition.

FIG. 3D shows a process flow of using the tuning gas at the substrate edge to prevent substrate backside etch by-product deposition. At operation 305, an etching gas (or gas mixture) is supplied to the plasma process chamber from the main gas source, such as from the gas distribution plate, and an inert gas is supplied from the tuning gas injection holes to the exposed region below the edge of the substrate. At operation 307, an etching plasma is generated by powering the electrode(s) and the inert gas is injected to the exposed region below the edge of the substrate to prevent the etch by-product from depositing in the exposed region below the edge of the substrate. With the introduction of the inert gas in the exposed region below the edge of the substrate, etch by-product deposition in that exposed region can be greatly reduced or completedly eliminated.

The concept of the injection of tuning gas toward the edge of the substrate from a bottom region of the chamber can be used any processing chamber. Even non-plasma processing chambers used for depositing or etching substrates can utilize this concept. For plasma processing chamber, the plasma source can be inductive, capacitive or a combination of both inductive and capacitive. The concept of the invention can be used for processing any type of substrates, including, but not limited to, semiconductor substrates, flat panel displays and solar panels.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

Broadly speaking, the embodiments of the present invention provide an improved plasma processing mechanism, apparatus, and method to increase the process uniformity at the very edge of the substrate. In one embodiment, a plasma processing chamber comprises a substrate support configured to receive a substrate, and a plurality of tuning gas injection holes surrounding the edge of the substrate, wherein the tuning gas injection holes supplies a tuning gas to the edge of the substrate during plasma processing of the substrate.

What is claimed is:

1. A plasma processing chamber, comprising:
a substrate support having a substrate support top surface configured to receive a substrate, the substrate support including an annular edge ring, the annular edge ring having a top surface substantially even with the substrate support top surface;
a main process gas feed for supplying a process gas, wherein the main process gas feed is located above the substrate support; and
a plurality of tuning gas injection channels defined within the annular edge ring, wherein the plurality of tuning gas injection channels supply a process tuning gas at an outer edge of the substrate support top surface to improve process uniformity at the edge of the substrate, wherein each of the plurality of tuning gas injection channels is pointed toward the center of the substrate oriented at an angle between about 0 degree to about 60 degrees from a vertical axis of the each of the plurality of tuning gas injection channels, the vertical axis being perpendicular to the substrate support top surface, the annular edge ring being proximate to an outer edge of the substrate support and the annular edge ring being coupled to the substrate support, and wherein the plurality of tuning gas injection channels are connected to an edge tuning gas plenum surrounding the substrate support, and wherein the edge tuning gas plenum is connected to a central tuning gas plenum through a plurality of tuning gas supply channels, the central tuning gas plenum being disposed below the substrate and within the substrate support and near-a center of the substrate support, and wherein the plurality of tuning gas supply channels are arranged evenly distributed around a circumference of the central tuning gas plenum in a spoke pattern.

2. The plasma processing chamber of claim 1, wherein the plurality of tuning gas injection channels are cylindrical and the diameters of the plurality of gas channels are between about 0.3 mm to about 5 mm.

3. The plasma processing chamber of claim 1, wherein there are at least 12 tuning gas supply channels.

4. The plasma processing chamber of claim 1, wherein there are at least 6 tuning gas supply channels.

5. The plasma processing chamber of claim 1, wherein the plurality of tuning gas injection channels are configured to direct a process tuning gas to be carried to a region above a surface of the edge of the substrate.

6. The plasma processing chamber of claim 1, wherein the process tuning gas includes at least one processing gas.

7. The plasma processing chamber of claim 1, wherein the plurality of tuning gas injection channels are configured to direct an inert gas to be carried to an exposed region below the edge of the substrate.

8. A tuning gas assembly for a plasma processing system, comprising:
    a plurality of tuning gas injection channels defined within an annular edge ring, the annular edge ring being proximate to an outer edge of a substrate support, the annular edge ring having a top surface substantially even with a substrate support top surface and the annular edge ring being coupled to the substrate support in the plasma processing system, wherein the plurality of tuning gas injection channels supply a process tuning gas in addition to a process gas supplied by a main process gas feed, wherein the process tuning gas is supplied proximate to an edge of the substrate support top surface to improve process uniformity at an edge of the substrate, wherein each of the plurality of tuning gas injection channels is pointed toward the center of the substrate oriented at an angle between about 0 degree to about 60 degrees from a vertical axis of the each of the plurality of tuning gas injection channels, the vertical axis being perpendicular to the substrate support top surface;
    an edge tuning gas plenum, wherein the plurality of tuning gas injection channels are connected to the edge tuning gas plenum surrounding the substrate support;
    a central tuning gas plenum disposed within and near a center of the substrate support and below the substrate; and
    a plurality of tuning gas supply channels, wherein the edge tuning gas plenum is connected to the central tuning gas plenum through the plurality of tuning gas supply channels, and wherein the plurality of tuning gas supply channels are arranged evenly distributed around a circumference of the central tuning gas plenum in a spoke pattern.

9. The tuning gas assembly of claim 8, wherein the plurality of tuning gas injection channels are cylindrical and the diameters of the plurality of tuning gas injection channels are between about 0.3 mm to about 5 mm.

10. The tuning gas assembly of claim 8, wherein there are at least 12 tuning gas supply channels.

11. The tuning gas assembly of claim 8, wherein there are at least 6 tuning gas supply channels.

12. The tuning gas assembly of claim 1, wherein the plurality of tuning gas injection channels are configured to direct a process tuning gas to be carried to a region above a surface of the edge of a substrate supported by the substrate support.

13. The plasma processing chamber of claim 1, wherein the plurality of tuning gas injection channels are configured to direct an inert gas to be carried to an exposed region below the edge of a substrate supported by the substrate support.

14. The plasma processing chamber of claim 9, wherein the plurality of tuning gas injection channels are configured to direct the tuning gas to be carried to an exposed region at the edge of the substrate and right below the edge of the substrate.

15. A plasma processing chamber, comprising: a chamber top; a chamber bottom; a plurality of chamber walls; each of the plurality of chamber walls connected to at least two other chamber walls, the chamber top and the chamber bottom; a first gas feed coupled to a first gas source, wherein the first gas feed is disposed in the chamber top; and a substrate support disposed on the chamber bottom, the substrate support including: a substrate support top surface configured to receive a substrate; an annular edge ring, the annular edge ring having: an annular edge ring top surface substantially parallel with the substrate support top surface and proximate to a perimeter of a received substrate; and a plurality of gas injection channels within the annular edge ring, each of the plurality of gas injection channels having a corresponding input coupled to a second gas source and a corresponding outlet terminating in a corresponding one of a plurality of gas injection ports in the annular edge ring top surface, the plurality of gas injection ports being proximate to and substantially evenly spaced around the perimeter of the received substrate, wherein each of the plurality of gas injection channels is oriented at an angle of between about 0 degrees to about 60 degrees from a vertical axis perpendicular to the substrate support top surface, wherein the at least one gas plenum input includes a plurality of gas plenum inputs coupled to a central tuning gas plenum through a plurality of tuning gas supply channels, the central tuning gas plenum being disposed within the substrate support and near a center of the substrate support, and wherein the plurality of tuning gas supply channels are arranged substantially evenly distributed around a circumference of the central tuning gas plenum in a spoke pattern.

16. The plasma processing chamber of claim 15, wherein each of the plurality of gas injection channels having corresponding inputs coupled to the second gas source includes a gas plenum having at least one gas plenum input coupled to the second gas source and a plurality of gas plenum outputs coupled to the corresponding inputs of the plurality of gas injection channels.

17. The plasma processing chamber of claim 16, wherein the gas plenum is an annular gas plenum included in the annular edge ring.

* * * * *